(12) United States Patent
Van Groningen et al.

(10) Patent No.: US 6,369,572 B1
(45) Date of Patent: Apr. 9, 2002

(54) MRI APPARATUS WITH A FEED FORWARD LOOP INSERTED IN THE GRADIENT LOOP

(75) Inventors: Wilhelmus Daniel Hyacinthus Van Groningen; Robbert Jacobus Van Wesenbeeck, both of Eindhoven; Paulus Petrus Joannes Van Den Bosch, Nuenen, all of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/716,897

(22) Filed: Nov. 20, 2000

(30) Foreign Application Priority Data

Nov. 19, 1999 (EP) .............................. 99203870

(51) Int. Cl.[7] ................................................ G01V 3/00
(52) U.S. Cl. ...................................... 324/322; 324/318
(58) Field of Search ........................ 324/322, 318, 324/300, 306, 307, 309, 314

(56) References Cited

U.S. PATENT DOCUMENTS 5,442,290 A   8/1995   Crooks ........................ 324/309
6,051,975 A * 4/2000   Mori et al. .................. 324/322
6,154,031 A * 11/2000  Hughes ....................... 324/322

\* cited by examiner

*Primary Examiner*—Louis Arana

(57) ABSTRACT

Gradient pulses are generated in an MRI apparatus by a control circuit in which disturbing influences are liable to occur; consequently, the gradient current pulses are not shaped exactly as prescribed by the input signal on the input (33) of the control circuit. This effect can be counteracted by feedback, but some deviations still remain because of a variety of capacitive and/or inductive elements (3, 51) in the control circuit. These deviations cannot be sufficiently corrected because of the limited bandwidth in the control circuit. According to the invention the control circuit is provided with a feed forward loop (57) which includes a filter (61, 63) whose filter characteristic is the inverse of the impedance characteristic of a component (3, 51) conducting the gradient. If the control circuit is also provided with a feedback loop, an A/D converter 41 can be inserted in the signal path in the case of a digital embodiment, and also a delay member (35) which precedes the analog-to-digital converter in order to delay the signal from the feed forward loop (57) in such a manner that the error signal e(t) assumes a very low amplitude. The analog-to-digital converter (41) can then be implemented so as to have a small bit width, with the result that the conversion rate can reach the desired high value.

7 Claims, 3 Drawing Sheets

MRI APPARATUS WITH A FEED FORWARD LOOP INSERTED IN THE GRADIENT LOOP

BACKGROUND OF THE INVENTION

The invention relates to a magnetic resonance apparatus which is provided with a gradient device which includes:
- at least one gradient coil for generating a magnetic gradient field in an imaging volume of the apparatus by means of gradient current pulses,
- a power amplifier for applying the gradient current pulses to the gradient coil,
- a control circuit which is connected to the input of the power amplifier in order to supply the power amplifier with a control signal representing the gradient current pulses, said control circuit being provided with a signal input for receiving an input signal wherefrom the control signal is derived.

An apparatus of this kind is known from U.S. Pat. No. 5,442,290.

Generally speaking, a medical MRI (Magnetic Resonance Imaging) apparatus is used to form images of an object to be imaged which is situated in an imaging volume of the apparatus in which a uniform, steady field (the so-called main field) exists. A gradient field which varies (usually linearly) as a function of the location is superposed on the main field so as to indicate, in the region to be imaged, the point (x, y, z) which is to be imaged at a given instant. Each point (x, y, z) in the region to be imaged is then indicated by the instantaneous value of an x gradient field, a y gradient field and a z gradient field. The time-dependent variation of these fields is shaped as a pulse, i.e. the so-called gradient pulse, which often has a trapezoidal shape and a duration of the order of magnitude of 1 ms. Said gradient fields are generated by pairs of coils (i.e. one pair for each of the x, y and z co-ordinates), each of which is traversed by associated gradient current pulses.

In the case of digital control of the formation of the gradient pulses in an MRI apparatus, the gradient current pulses generating the pulse-shaped gradient fields are composed of directly successive sub-pulses which will be referred to hereinafter as gradient pulse samples and are produced by a power amplifier which is controlled by an input signal which assumes discrete values only. This input signal can be produced by a converter, for example a pulse width converter (PWM converter) which forms part of a control circuit specifying the appearance of the gradient pulses.

The cited United States patent discloses, notably FIG. 1 and the associated description, an MRI apparatus which includes a gradient device with a gradient coil which is fed by a control loop. The control loop includes a control circuit and a power amplifier in the form of a pulse width modulated power supply source. As is known, PWM power supply sources deliver an output current in the form of a pulse series whose mean value constitutes the desired output current. In addition to the (desired) mean value, the output current also contains undesirable higher harmonics which may have a disturbing effect on the operation of the MRI apparatus. In order to remove such higher harmonics from the output current, a low-pass filter is arranged between the power amplifier and the gradient coil. A control circuit in the form of a comparator is connected to the input of the power amplifier, one input of said comparator receiving a sawtooth reference signal whereas another input receives the time integrated value of the difference between the desired current and the observed current through the gradient coil. In this known configuration the output signal delivered by the comparator constitutes the control signal representing the gradient current pulses whereas the signal applied to the latter input of the comparator is the input signal wherefrom the control signal is derived.

A variety of effects may occur in the control loop of a gradient device, both internally within the loop as externally, with the result that the shape of the gradient current pulse through the gradient coil is not exactly as specified by the input signal applied to the signal input of the control circuit. In order to counteract the effect of such disturbing influences, the current through the gradient coil in the known gradient device is fed back to the signal input of the control circuit. As a result, the actual shape of the gradient current pulse approximates the desired shape more closely. However, a deviation remains which is due to the presence of a variety of capacitive and/or inductive elements in the gradient loop from the signal input for the desired signal up to and including the gradient coil; due to the finite bandwidth of the fed back gradient loop, however, the effect thereof cannot be corrected by feedback.

SUMMARY OF THE INVENTION

It is an object of the invention to provide a magnetic resonance apparatus wherein the gradient device more closely approximates the desired shape of the gradient current pulse. To this end, the apparatus according to the invention is characterized in that between the signal input of the control circuit and a point preceding the input of the power amplifier there is inserted a feed forward loop which includes at least one filter whose impedance characteristic is the inverse of the impedance characteristic of at least one of the components traversed by the output current of the power amplifier.

The signal having the desired shape of the gradient current pulse is applied to the input of the feed forward loop, i.e. to the point where the feed forward loop is connected to the signal input. This signal is distorted by said filter having the inverse impedance characteristic; the effect thereof consists in that the distortion caused by said component traversed by the output current of the power amplifier is such that it cancels the former distortion.

The power amplifier in a preferred embodiment of the invention is constructed as a pulse width modulatable amplifier which is succeeded by a power output stage, the output of the feed forward loop being connected to the input of the pulse width modulatable amplifier. Because the output signal of the feed forward loop is applied to a point in the control circuit of the gradient coil where a comparatively low power level exists, the components in the feed forward loop may be constructed as low power types, thus enabling an inexpensive implementation which does not require a large volume.

The filter having the inverse impedance characteristic is constructed so as to be digital in a further preferred embodiment of the invention. It is often very difficult to design an analog filter having an impedance characteristic which is the inverse of a given impedance characteristic. Moreover, due to manufacturing tolerances of the components, the desired filter characteristic may still deviate from the design, so that the desired effect is not attained. These problems are avoided in the case of a digital construction of the inverse filter.

A feedback loop is provided between the gradient coil and the signal input of the control circuit in a further embodiment of the invention. This embodiment enables a first, coarse correction to be made in respect of deviations between the desired and the actual gradient current pulse. The filter in the feed forward loop can then be designed for a smaller signal range; this aspect is of importance notably for a digital filter, considering the width of a variety of registers, for example the number of bits determining the dimension (and hence the speed) of an analog-to-digital converter in the digital filter.

The feedback loop in a further preferred embodiment of the invention includes a difference forming device which is connected so as to succeed the signal input of the control circuit, a delay member being connected between the input of the feed forward loop and the difference forming device. This step offers the following advantageous effect: in the forward loop, like in the direct control loop of the gradient coil and in the feedback loop, a signal delay is introduced relative to the input signal wherefrom the control signal is derived. The signal which is fed back by the feedback loop is compared with said input signal. Due to the delay of the fed back signal, this comparison would still yield a difference in the case of identical signal shapes; this is, of course, undesirable. In order to carry out the comparison correctly, the input signal applied to the signal input of the control circuit is delayed by the same delay as that experienced in the control loop by the signal fed back to the difference forming device. Due to the presence of the delay member ahead of the difference forming device of the feedback loop, therefore, the delay of the various signal paths can be made equal. The magnitude of the signal subsequent to the difference forming device (so the amplitude thereof) is dependent on the magnitude of the difference in the signal delay, notably at the area of the positive going and negative going edge of the usually trapezoidal gradient current pulse. By making this difference zero (meaning that it is significantly reduced in practice), the maximum value of the signal directly subsequent to the difference forming device can be kept small, so that the components succeeding the difference forming device can be constructed so as to have small dimensions.

In a further embodiment of the invention an analog-to-digital converter is connected between the difference forming device and the signal input of the control circuit. In the case of a digital construction of the part of the control loop succeeding the difference forming device, an analog-to-digital converter should be arranged so as to precede this part of the control circuit. For the above-mentioned small amplitude of the signal to be processed by this converter, the number of bits determining the dimension of the analog-to-digital converter can be kept small, so that its speed may be high or, alternatively, its resolution may be higher for the same number of bits.

In a further embodiment according to the invention the magnetic resonance apparatus is provided with at least one low-pass filter which is connected in series with the gradient coil, the feed forward loop in said magnetic resonance apparatus including a first filter whose impedance characteristic is the inverse of the impedance characteristic of the gradient coil and also including a second filter whose impedance characteristic is the inverse of the impedance characteristic of said low-pass filter. The deviations between the desired shape and the actual shape of the gradient current pulse are often caused mainly by the presence of a variety of capacitive and/or inductive effects in said two components. In those cases it is important to counteract the effects thereof by introducing the inverse impedance characteristics in the feed forward loop.

BRIEF DESCRIPTION OF THE DRAWINGS

The invention will be described in detail hereinafter with reference to the Figures in which corresponding reference numerals denote corresponding elements. Therein.

DESCRIPTION OF THE PREFERRED EMBODIMENTS

Figure 1:
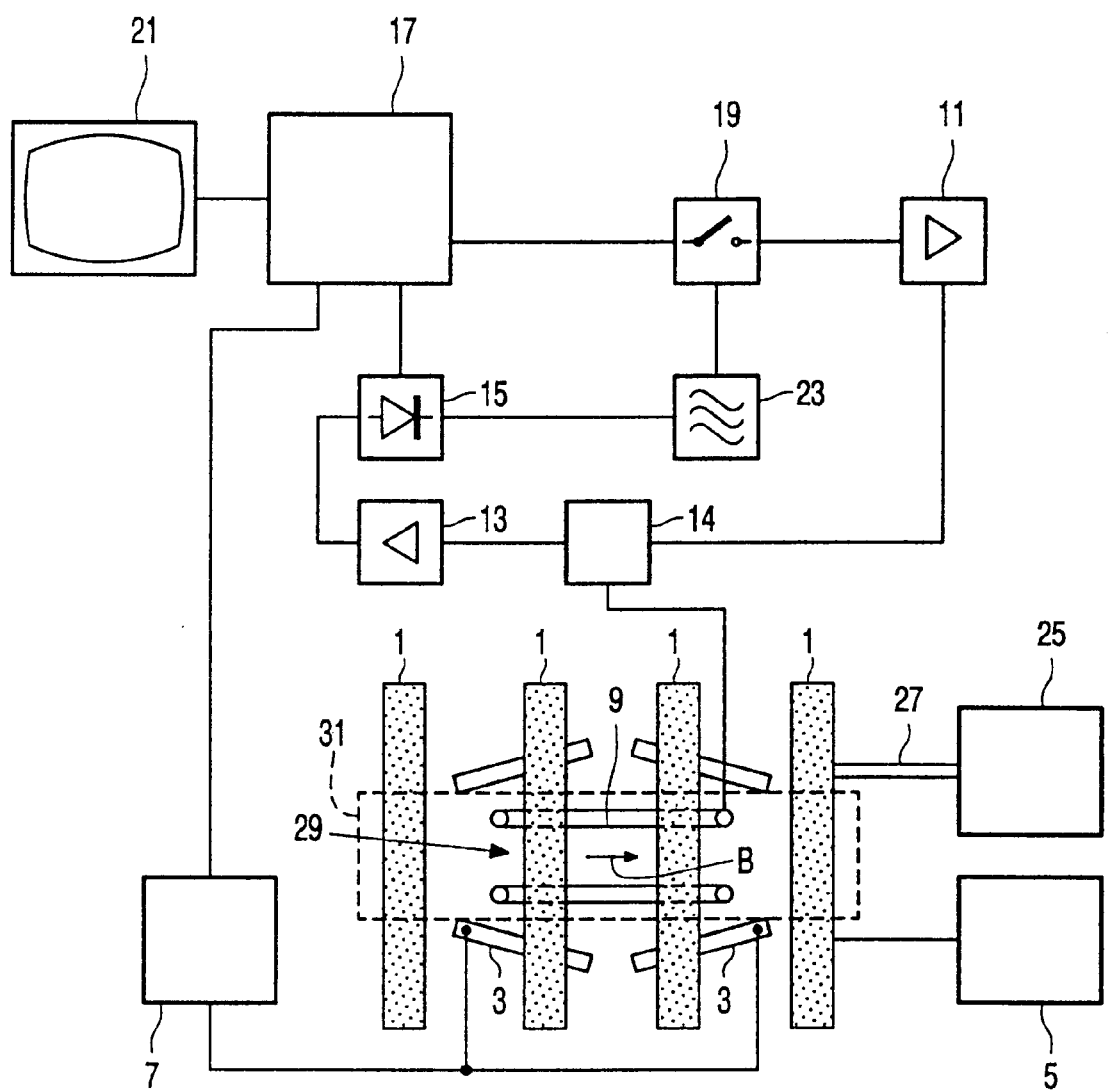
FIG. 1 shows diagrammatically the general construction of a customary magnetic resonance apparatus.

The magnetic resonance apparatus which is diagrammatically shown in FIG. 1 includes a first magnet system 1 for generating a steady magnetic field B, a second magnet system 3 (the gradient coil system) for generating magnetic gradient fields, a power amplifier 7 for the gradient coil system 3, and a power supply source 5 for the first magnet system 1. An RF coil 9 serves to generate an RF magnetic alternating field; to this end, it is connected to an RF transmission device which includes an RF source 11. The RF coil 9 can also be used for the detection of spin resonance signals generated by the RF transmission field in an object to be examined (not shown); to this end, the RF coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. An RF oscillator 23 controls the modulator 19 as well as the detector 15 which processes measuring signals. A cooling device 25 with cooling ducts 27 is provided for cooling the magnet coils of the first magnet system 1. The RF coil 9, being arranged within the magnet systems 1 and 3, encloses an imaging volume 29 which is large enough to accommodate a patient, or a part of a patient, to be examined in an apparatus for medical diagnostic measurements, for example, the head and the neck. Thus, a steady magnetic field B, gradient fields for selecting object slices, and a spatially uniform RF alternating field can be generated in the measuring space 29. The RF coil 9 can combine the functions of transmission coil and measuring coil; in that case a separating circuit 14 is provided in order to separate the forward and the return signal traffic. It is alternatively possible to use different coils for the two functions, for example surface coils then acting as measuring coils. If desired, the coil 9 may be enclosed by an RF field shielding Faraday cage 31.

Figure 2:
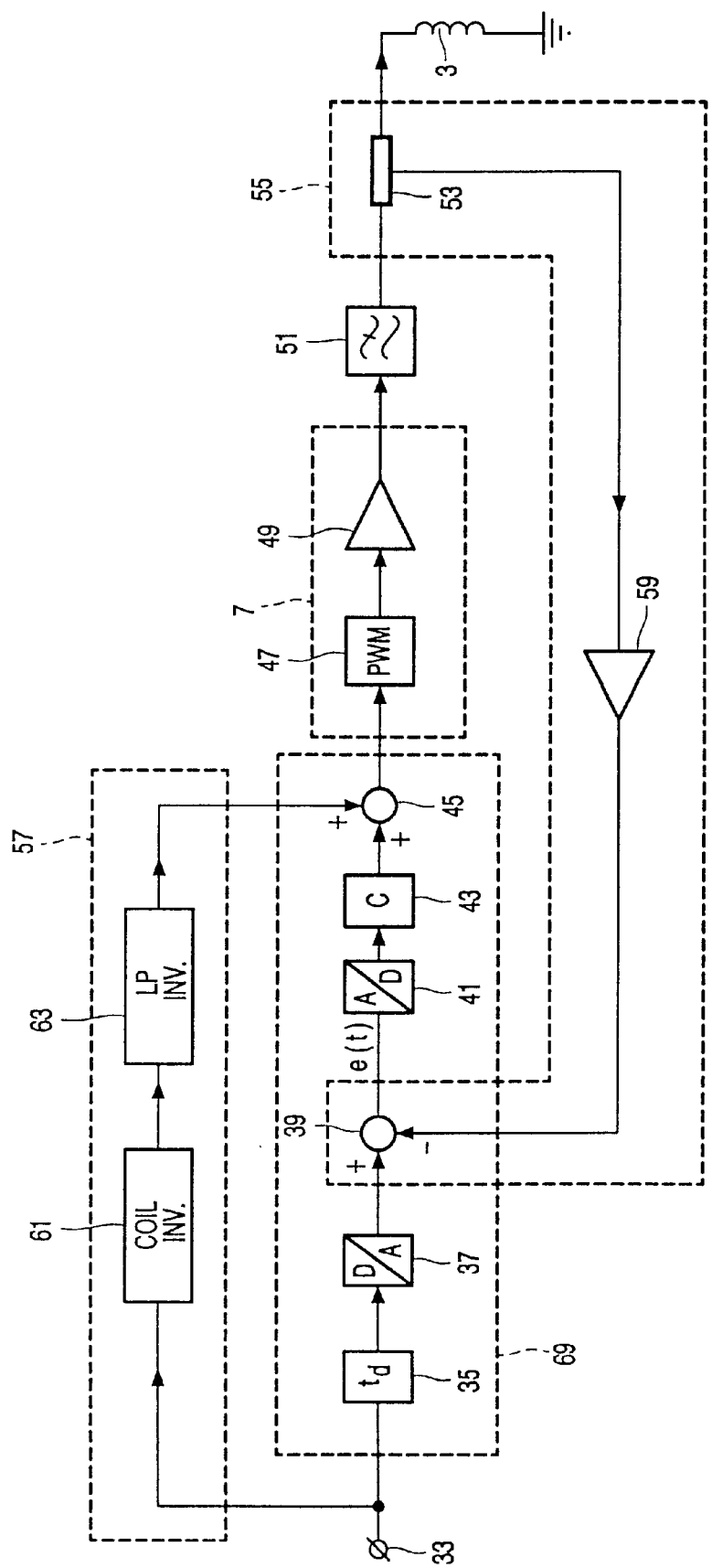
FIG. 2 shows a diagram illustrating a gradient loop for producing gradient pulses.

FIG. 2 is a more detailed representation of a gradient loop for producing gradient current pulses generating the pulse-shaped magnetic gradient field. The user of the MRI apparatus according to the invention selects a given imaging mode; this selection is received by a computer which is not shown in the Figure. Depending on the selected imaging mode, the computer determines the shape and other parameters of the gradient current pulses associated with the relevant imaging mode. An example in this respect is a gradient current pulse which has a trapezoidal shape and parameters such as a pulse duration of 2 ms, a rise time and a fall time of 0.2 ms each, and an amplitude of 600 V. On the basis of this data the computer calculates the number and the magnitude of the associated gradient pulse samples.

The gradient loop which is shown in FIG. 2 consists of three branches, i.e. a main loop, a feedback loop 55 and a feed forward loop 57. The main loop extends between the signal input 33 and the gradient coil 3. This loop is formed by successively a delay element 35, a digital-to-analog converter 37, a difference forming device 39, an analog-todigital converter 41, a compensation network 43, an adder circuit 45, a power amplifier 7 which is constructed as an assembly of a PWM converter 47 and a power output stage 49, a low-pass filter 51, a current sensor 53 and a gradient coil 3.

The feedback loop 55 is connected between the gradient coil 3 and a connection point subsequent to the signal input 33 of the control circuit 69; it is connected notably between an output of the current sensor 53 and the inverting input of the difference forming device 39. The feedback loop includes an amplifier 59 for amplifying the signal fed back by this loop.

The feed forward loop 57 is connected between the signal input 33 of the control circuit 69 and a point preceding the input of the power amplifier 7; more specifically, it is situated between the signal input 33 and one of the two inputs of the adder circuit 45. The feed forward loop 57 includes a first filter 61, the impedance characteristic of the filter 61 being the inverse of the impedance characteristic of the gradient coil 3. The feed forward loop also includes a second filter 63 for the compensation of a part of the distortion caused by the low-pass filter 51. The low-pass filter 51 serves to remove the higher harmonics introduced by the PWM converter 47. However, the desired signal (i.e. the direct current component of the output signal of the PWM converter) is also degraded thereby. The inverse filter 63 provides compensation for such undesirable degradation in that the impedance characteristic of the filter 63 is the inverse of the impedance characteristic of the low-pass filter 51.

The gradient pulses determined by said computer, i.e. the desired variation of the gradient current as a function of time, is applied to the input 33 of the gradient loop shown in FIG. 2, so that this signal waveform is applied to the feed forward loop as well as to the main loop. At that area this signal waveform has a digital shape. Ignoring for the time being the delay caused by the delay member 35, the signal received on the input 33 is converted into analog form in the digital-to-analog converter 37, so that an analog signal appears on the non-inverting input of the difference forming device 55 as well as on the output thereof. The latter signal is digitized again by the analog-to-digital converter 41, after which it is applied to the compensation network 43. The latter network performs a compensation for signal distortions, if any, which may occur in the main loop preceding this network; the network may also include a control circuit such as a known PID controller. Subsequently, the (digital) signal originating from the compensation network 43 is applied to one of the two inputs of the adder circuit 45. The other input of the adder circuit 45 serves to receive the signal originating from the feed forward loop 57. The signal originating from the adder circuit 45 controls the PWM converter 47 so as to produce a pulse-shaped signal whose instantaneous direct current contents are a measure of the instantaneous value of the gradient current. The PWM signal thus formed is applied to the power output stage 49, after which the higher harmonics introduced by the PWM converter are filtered out by the low-pass filter 51. The filtered power signal then constitutes the desired gradient current pulse.

In series with the low-pass filter 51 and the gradient coil 3 there is connected a current sensor 53 for deriving a signal which is a measure of the gradient current. The output of this sensor constitutes the input of the feedback loop 55 which also includes an amplifier 59 for amplifying the fed back signal. The output signal of the amplifier 59 is applied to the inverting input of the difference forming device 39. In the difference forming device the feedback signal is subtracted from the (analog) input signal, so that the error signal to be further processed remains on the output of the difference forming device. If no feed forward loop and no delay element 35 were included in the gradient loop, a delay would occur between the input signal and the feedback signal so that the error signal could still assume significant values. This means that the analog-to-digital converter 41 should have a comparatively large bit width as is generally known for such converters; such a bit width would be at the expense of the maximum speed of these converters.

The feed forward loop 57 consists of two digitally constructed inverse filters 61 and 63. The impedance characteristic of these filters is chosen to be such that they compensate for the signal distortion introduced by the gradient coil 3 and the low-pass filter 51, respectively. A substantial part of the control of the gradient loop takes place via the feed forward loop 57. Because of the digital construction of the filters 61 and 63, it is achieved that compensation can always take place for the deviations of the gradient coil 3 as well as those of the low-pass filter, i.e. both in respect of their general properties which stem from their design as well as in respect of individual deviations stemming from manufacturing tolerances of their components. Due to the presence of the delay element 35 in the main loop, the signal delay caused by the feedback loop 55 is compensated, thus offering the advantageous effect to be described with reference to FIG. 3.

Figure 3:
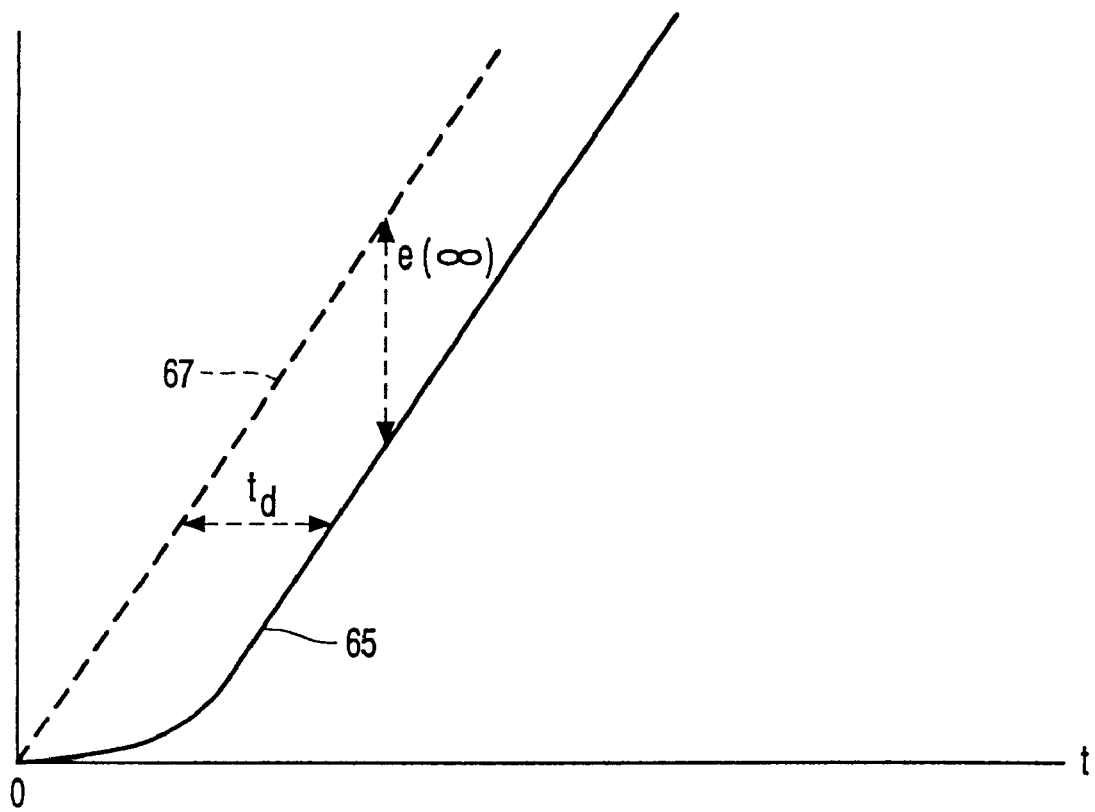
FIG. 3 shows a graph illustrating the effect of the feed forward delay compensation.

FIG. 3 illustrates the effect of the delay element 35 on the signal in the main loop. The line 65 in this Figure represents the variation in time of the desired gradient current. In this respect it is assumed that the variation of the gradient pulse is trapezoidal, the line 67 being the rising edge of the trapezoidal shape. The variation in time of the actual gradient current is represented by the line 67. Due to the presence of the feedback loop, which cannot make control so fast that the signal delay is always sufficiently small, this signal has been delayed by a period $t_d$ relative to the desired signal. Because of this difference, the error signal e, being the vertical distance between the desired signal and the actual signal, assumes an undesirably high value. This effect can be considerably mitigated by imparting a given delay to the desired signal, i.e. a delay of the same order of magnitude as said signal delay. In FIG. 3 this would appear as a shift of the line 67 in the direction of the line 65, so that the vertical distance between these two lines can be made sufficiently small, i.e. so small that the bit width of the analog-to-digital converter 41 does not restrict the desired conversion speed. It is to be noted that in an MRI system it is not desirable that the control of the feedback loop is absent, i.e. that the signal in this loop is zero for a prolonged period of time; this situation occurs when the error signal is between two bit levels. This is because the time integral of the gradient current is an important quantity involved in the indication of the point in the imaging volume to be imaged. If the signal in the feedback loop were very small for a prolonged period of time, a value zero could appear time and again on the output of the analog-to-digital converter due to rounding whereas said time integral would still increase. Therefore, it is desirable that a signal unequal to zero is always present in the feedback loop.

What is claimed is:

1. A magnetic resonance apparatus which is provided with a gradient device which includes:

at least one gradient coil (3) for generating a magnetic gradient field in an imaging volume (29) of the apparatus by means of gradient current pulses, a power amplifier (7) for applying the gradient current pulses to the gradient coil (3), a control circuit (69) which is connected to the input of the power amplifier in order to supply the power amplifier with a control signal representing the gradient current pulses, said control circuit being provided with a signal input (33) for receiving an input signal wherefrom the control signal is derived, characterized in that between the signal input (33) of the control circuit (69) and a point preceding the input of the power amplifier (7) there is inserted a feed forward loop (57) which includes at least one filter (61, 63) whose impedance characteristic is the inverse of the impedance characteristic of at least one of the components traversed by the output current of the power amplifier.

2. A magnetic resonance apparatus as claimed in claim 1, wherein the power amplifier (7) is constructed as a pulse width modulatable amplifier (47) which is succeeded by a power output stage (49), the output of the feed forward loop (57) being connected to the input of the pulse width modulatable amplifier.

3. A magnetic resonance apparatus as claimed in claim 1, wherein the filter having the inverse impedance characteristic is constructed so as to be digital.

4. A magnetic resonance apparatus as claim 1, wherein a feedback loop (55) is provided between the gradient coil (3) and the signal input (33) of the control circuit (69).

5. A magnetic resonance apparatus as claimed in claim 4, wherein the feedback loop (55) includes a difference forming device (39) which is connected so as to succeed the signal input of the control circuit (69), a delay member (35) being connected between the input (33) of the feed forward loop (57) and the difference forming device (39).

6. A magnetic resonance apparatus as claimed in claim 5, wherein an analog-to digital converter (37) is connected between the difference forming device (39) and the signal input (33) of the control circuit.

7. A magnetic resonance apparatus as claim 1 which is provided with at least one low-pass filter (51) which is connected in series with the gradient coil (3), the feed forward loop (57) in said magnetic resonance apparatus including a first filter (61) whose impedance characteristic is the inverse of the impedance characteristic of the gradient coil (3) and also including a second filter (63) whose impedance characteristic is the inverse of the impedance characteristic of said low-pass filter (51).

* * * * *